(12) United States Patent
Choi et al.

(10) Patent No.: US 12,417,895 B2
(45) Date of Patent: Sep. 16, 2025

(54) SAMPLE HOLDER FOR TRANSMISSION ELECTRON MICROSCOPE, SAMPLE ANALYSIS SYSTEM INCLUDING THE SAME, AND METHOD FOR ANALYZING SAMPLE USING THE SAME

(71) Applicant: SAMSUNG ELECTRONICS CO., LTD., Suwon-si (KR)

(72) Inventors: Yeoseon Choi, Suwon-si (KR); Donghoon Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 241 days.

(21) Appl. No.: 18/324,437

(22) Filed: May 26, 2023

(65) Prior Publication Data

US 2024/0153734 A1     May 9, 2024

(30) Foreign Application Priority Data

Nov. 3, 2022   (KR) .................... 10-2022-0145393

(51) Int. Cl.
*H01J 37/20* (2006.01)
*H01J 37/26* (2006.01)

(52) U.S. Cl.
CPC ............. *H01J 37/20* (2013.01); *H01J 37/26* (2013.01); *H01J 2237/2001* (2013.01); *H01J 2237/202* (2013.01); *H01J 2237/20228* (2013.01); *H01J 2237/20235* (2013.01); *H01J 2237/20278* (2013.01); *H01J 2237/204* (2013.01); *H01J 2237/2065* (2013.01)

(58) Field of Classification Search
CPC .... H01J 37/20; H01J 37/26; H01J 2237/2001; H01J 2237/202; H01J 2237/20228; H01J 2237/20235; H01J 2237/20278; H01J 2237/204; H01J 2237/2065
See application file for complete search history.

(56) References Cited

U.S. PATENT DOCUMENTS

| | | | |
|---|---|---|---|
| 7,115,882 B2 | 10/2006 | Moore | |
| 7,420,184 B2 | 9/2008 | Van De Water et al. | |
| 9,887,065 B2 | 2/2018 | Zandbergen | |
| 2020/0161080 A1* | 5/2020 | Chun | H01J 37/32724 |

FOREIGN PATENT DOCUMENTS

| | | |
|---|---|---|
| JP | H10283962 | 10/1998 |
| JP | 2011129343 | 6/2011 |
| JP | 6279692 | 2/2018 |
| JP | 2018078028 | 5/2018 |
| JP | 6764902 | 10/2020 |

* cited by examiner

*Primary Examiner* — Mark R Gaworecki
(74) *Attorney, Agent, or Firm* — Morgan, Lewis & Bockius LLP (57) ABSTRACT

A sample holder for a transmission electron microscope may include: a column part that extends in a first direction; a stage configured to receive a sample, the stage disposed at a first end portion of the column part; a motor part disposed at a second end portion of the column part; and a thermoelectric cooling device disposed inside the column part.

15 Claims, 8 Drawing Sheets

SAMPLE HOLDER FOR TRANSMISSION ELECTRON MICROSCOPE, SAMPLE ANALYSIS SYSTEM INCLUDING THE SAME, AND METHOD FOR ANALYZING SAMPLE USING THE SAME

CROSS-REFERENCE TO RELATED APPLICATION

This application claims priority under 35 U.S.C. § 119 to Korean Patent Application No. 10-2022-0145393, filed in the Korean Intellectual Property Office on Nov. 3, 2022, the entire contents of which are herein incorporated by reference.

TECHNICAL FIELD

The present disclosure relates to a sample holder for a transmission electron microscope, a sample analysis system including the same, and a method for analyzing a sample using the same.

DESCRIPTION OF RELATED ART

A microscope is an optical device that uses one or more lens to produce a magnified image of a small object. A resolution of a microscope is inversely proportional to a wavelength of a light source that illuminates an object. As the wavelength of the light source is reduced, less diffraction may occur so that the object may be seen more clearly. The resolution may refer to an ability to distinguish two objects that are separated from each other, and if the resolution is low, it may not be possible to distinguish whether the two objects are separated or attached.

A smaller object may not be clearly seen through an optical microscope that uses visible light of at least 400 nm. Since an electron, and in particular an electron beam, has a property of a wave (i.e., a matter wave), the electron beam may be used as a source of illumination. Since a wavelength of the electron beam is about 0.1 nm, which is about 1000 times shorter than a wavelength of light used by an optical microscope, a resolution of the electron may be relatively high so that a small sample may be precisely seen. An image of a sample may be generated by detecting electrons scattered through the sample.

When a sample to be magnified is thin, an image may be obtained by directly passing the electron beam through the sample. An electron microscope that obtains an image by transmitting the electron beam is called a transmission electron microscope (TEM). Because the transmission electron microscope is sensitive to an electromagnetic field and vibration, the electron microscope may be installed in a place such as a basement of a building. In addition, since a molecule in an atmosphere may scatter an electron, the electron microscope may include a volume maintained with a high vacuum. To maintain a vacuum level inside the volume and the performance of an energy dispersive X-ray spectroscopy (EDS) detector of the electron microscope, liquid nitrogen (LN2) may be used to lower an internal temperature of the electron microscope.

When a sample holder for the electron microscope and a sample to be imaged are inserted from the outside to the inside of the electron microscope, a drift phenomenon may occur due to a temperature difference between the sample holder and the sample, and the inside of the electron microscope.

SUMMARY

Embodiments provide a sample holder for a transmission electron microscope, a sample analysis system including the same, and a method for analyzing a sample using the same capable of substantially preventing a drift phenomenon of the sample due to a temperature difference between the sample holder and the sample, and the inside of the transmission electron microscope.

A sample holder for a transmission electron microscope according to an embodiment may include: a column part that extends in a first direction; a stage configured to receive a sample, the stage disposed at a first end portion of the column part; a motor part disposed at a second end portion of the column part; and a thermoelectric cooling device disposed inside the column part.

According to an embodiment, the thermoelectric cooling device may include a core-shell structure that extends in the first direction.

The thermoelectric cooling device may include: a heat radiating portion disposed at a center of the thermoelectric cooling device; and a cooling portion that is spaced apart from the heat radiating portion and surrounds the heat radiating portion.

The heat radiating portion may have a cylindrical shape and the cooling portion may have a hollow cylindrical shape.

The thermoelectric cooling device may include a coil structure that extends in the first direction.

The thermoelectric cooling device may have a shape winding around a central axis extending parallel to the first direction.

The sample holder may further include an auxiliary thermoelectric cooling device disposed adjacent to at least one of the column part and a periphery of the stage.

The auxiliary thermoelectric cooling device may include a core-shell structure that extends in the first direction.

The sample holder may further include a battery disposed in the motor part.

The battery may be electrically connected to the thermoelectric cooling device.

A sample analysis system according to an embodiment may include: a transmission electron microscope; a sample holder insertable in the transmission electron microscope; and a controller that is connected to the sample holder to control the sample holder. The sample holder may include: a column part that extends in a first direction; a stage disposed at a first end portion of the column part; a motor part disposed at a second end portion of the column part; and a thermoelectric cooling device configured to disposed inside the column part.

The thermoelectric cooling device may include a core-shell structure that extends in the first direction.

The thermoelectric cooling device may include: a heat radiating portion disposed at a center of the thermoelectric cooling device; and a cooling portion that is spaced apart from the heat radiating portion and surrounds the heat radiating portion.

The thermoelectric cooling device may include a coil structure that extends in the first direction.

The sample holder may further include an auxiliary thermoelectric cooling device disposed adjacent to at least one of the column part and a periphery of the stage.

The sample holder may further include a battery disposed in the motor part, wherein the battery is electrically connected to the thermoelectric cooling device.

A method for analyzing a sample according to an embodiment may include: positioning the sample on a stage of a sample holder; cooling the sample and the sample holder using a thermoelectric cooling device; moving the sample holder into a transmission electron microscope; and analyzing the sample.

The sample holder may include: a column part that extends in a first direction, wherein the stage is disposed at a first end portion of the column part; and a motor part disposed at a second end portion of the column part, wherein the thermoelectric cooling device is disposed inside the sample holder and extends in the first direction.

The analyzing of the sample may be performed immediately after the sample holder is moved into the transmission electron microscope.

The analyzing of the sample may include charging a battery of the sample holder while the sample is analyzed.

According to some embodiments, the drift phenomenon of the sample due to the temperature difference between the inside and the outside of the transmission electron microscope may be substantially prevented without requiring additional time.

In addition, according to some embodiments, it may be possible to improve quality of a sample analysis image using the transmission electron microscope.

DETAILED DESCRIPTION

Aspects of the present disclosure will be described more fully hereinafter with reference to the accompanying drawings, in which embodiments of the invention are shown. As those skilled in the art would realize, embodiments may be modified in various different ways, all without departing from the spirit or scope of the present invention.

In order to clearly describe embodiments of the present invention, parts or portions that are irrelevant to the description may be omitted, and identical or similar constituent elements throughout the specification are denoted by the same reference numerals.

Further, in the drawings, the size and thickness of each element may be arbitrarily illustrated for ease of description, and embodiments of the present disclosure is not necessarily limited to those illustrated in the drawings. In the drawings, the thicknesses of layers, films, panels, regions, areas, etc., may be exaggerated for clarity. In the drawings, for ease of description, the thicknesses of some layers and areas may be exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned or disposed on or below the object portion, and does not necessarily mean positioned or disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion.

Hereinafter, a first sample holder 10 for a transmission electron microscope according to an embodiment will be described with reference to FIG. 1, FIG. 2, and FIG. 3.

Figure 1:
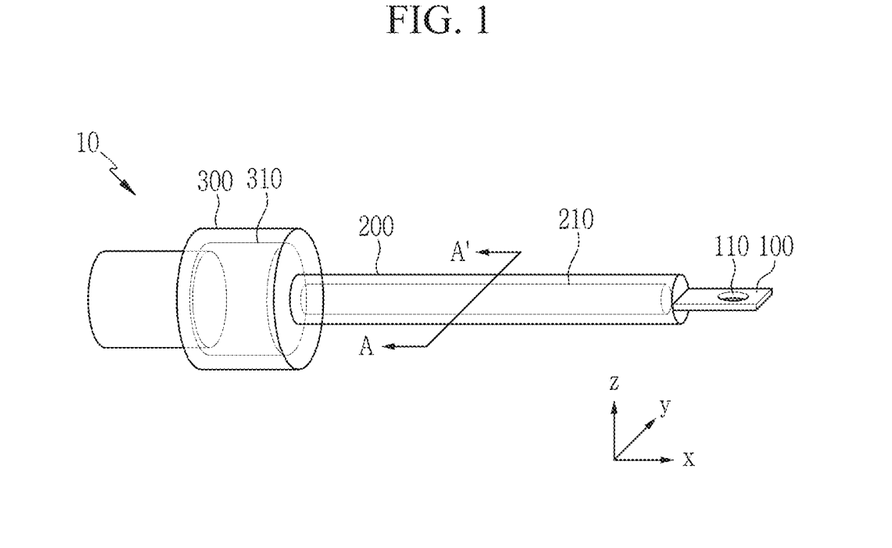
FIG. 1 is a perspective view illustrating a sample holder for a transmission electron microscope according to an embodiment.

FIG. 1 is a perspective view illustrating the first sample holder 10 for the transmission electron microscope according to an embodiment. FIG. 2 is a cross-sectional view taken along line A-A' of FIG. 1. FIG. 3 is a conceptual view illustrating a principle of a thermoelectric cooling device of the first sample holder 10 for the transmission electron microscope according to an embodiment.

Figure 2:
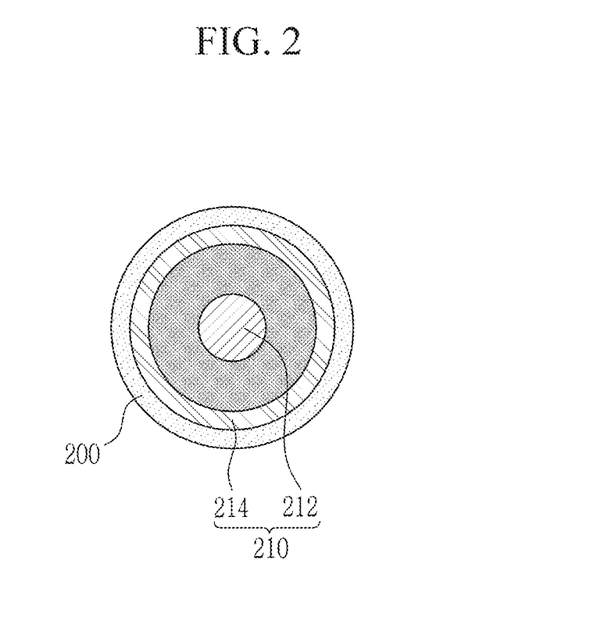
FIG. 2 is a cross-sectional view taken along line A-A' of FIG. 1.

As shown in FIG. 1 and FIG. 2, the first sample holder 10 for the transmission electron microscope according to an embodiment may include a column part 200, a stage 100 positioned at a first end portion of the column part 200, and a motor part 300 positioned at a second end portion of the column part 200. The first end portion and the second end portion of the column part 200 may be opposite ends.

The column part 200 may be elongated along a first direction x. The column part 200 may have a hollow cylindrical shape.

A first thermoelectric cooling device 210 may be positioned inside the column part 200. The first thermoelectric cooling device 210 may be an element using a thermoelectric cooling method. The thermoelectric cooling method may generate a heat flux between junctions of two materials using a Peltier effect. In this case, the two materials may use two types of metals, which form a thermoelectric couple. For example, the materials may include alloys of bismuth and tellurium, or a P-type semiconductor and an N-type semiconductor. In addition, an efficiency of the first thermoelectric cooling device 210 may be improved through a combination of various semiconductor materials. The first thermoelectric cooling device 210 may transfer heat from one side of the device to the other side of the device while consuming electrical energy in a direction of an electric current. In this case, it may be possible to change between heat absorption and heat generation by controlling a direction of the electric current. Furthermore, if may be possible to adjust an amount of the heat absorption and an amount of the heat generation according to a strength of the electric current.

Hereinafter, referring to FIG. 3, an internal structure and an operating principle of the first thermoelectric cooling device 210 will be described.

Figure 3:
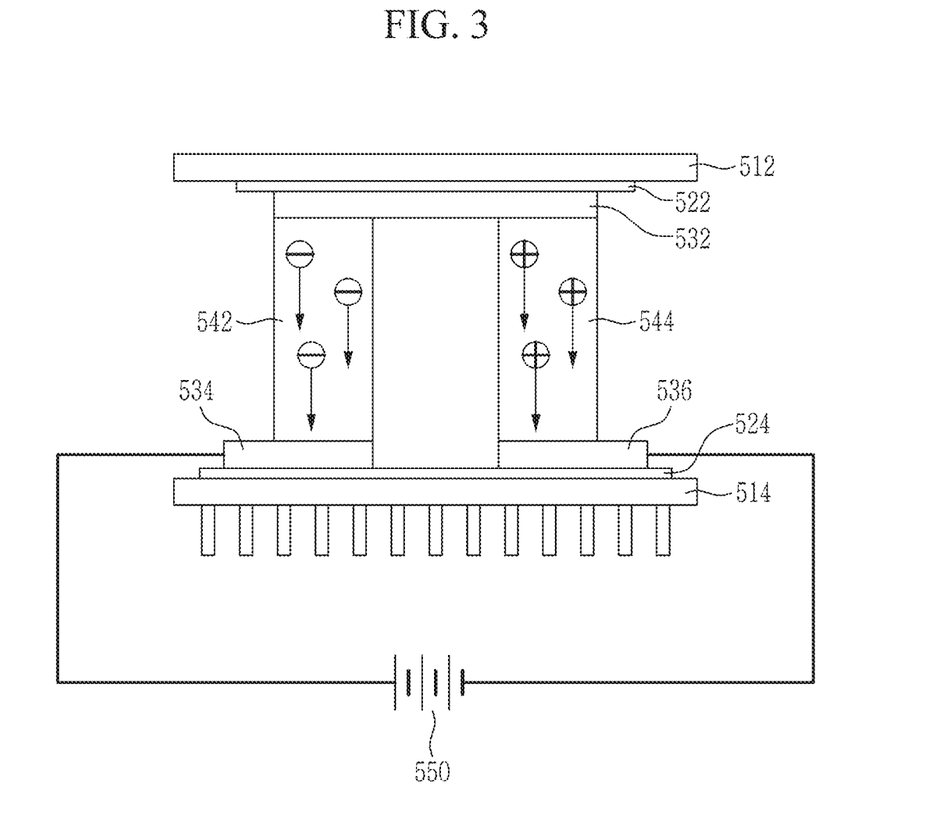
FIG. 3 is a conceptual view illustrating a principle of a thermoelectric cooling device of the sample holder for the transmission electron microscope according to an embodiment.

As shown in FIG. 3, the first thermoelectric cooling device 210 may include a first ceramic substrate 522 and a second ceramic substrate 524 facing each other, a cooling plate 512 positioned outside of the first ceramic substrate 522, a first electrode 532 positioned inside of the first ceramic substrate 522, a heatsink 514 positioned outside of the second ceramic substrate 524, and a second electrode 534 and a third electrode 536 positioned inside of the second ceramic substrate 524. In addition, the first thermoelectric cooling device 210 may further include an N-type semiconductor 542 positioned between the first electrode 532 and the second electrode 534 and a P-type semiconductor 544 positioned between the first electrode 532 and the third electrode 536. In addition, the first thermoelectric cooling device 210 may further include a power source 550 connected to the second electrode 534 and the third electrode 536. For example, the power source 550 may be electrically connected between the second electrode 534 and the third electrode 536.

The first ceramic substrate 522 and the second ceramic substrate 524 may include alumina ($Al_2O_3$) (i.e., aluminum oxide). However, materials of the first ceramic substrate 522 and the second ceramic substrate 524 are not limited thereto, and other materials may be used. The first ceramic substrate 522 and the second ceramic substrate 524 may face each other. An inner surface of the first ceramic substrate 522 may face the second ceramic substrate 524, and an outer surface of the first ceramic substrate 522 may be positioned opposite to the inner surface. The inner surface of the first ceramic substrate 522 may contact the first electrode 532, and the outer surface of the first ceramic substrate 522 may contact the cooling plate 512. An inner surface of the second ceramic substrate 524 may face the first ceramic substrate 522, and an outer surface of the second ceramic substrate 524 may be positioned opposite to the inner surface. The inner surface of the second ceramic substrate 524 may contact the second electrode 534 and the third electrode 536, and the outer surface of the second ceramic substrate 524 may contact the heatsink 514.

The cooling plate 512 may be coupled to the first ceramic substrate 522 and may serve to remove heat from an object positioned around the cooling plate 512. The removal of heat from the object may cool the object. The heatsink 514 may be coupled to the second ceramic substrate 524. Heat absorbed by the cooling plate 512 may be transferred to the second electrode 534 and the third electrode 536 via the first electrode 532 and may reach the heatsink 514. For example, the heat may be conducted to the heatsink 514.

The first electrode 532, the second electrode 534, and the third electrode 536 may be made of a conductive material. The first electrode 532, the second electrode 534, and the third electrode 536 may be made of a metal material. For example, each of the first electrode 532, the second electrode 534, and the third electrode 536 may include copper. Embodiments of the present invention are not limited thereto, and each of the first electrode 532, the second electrode 534, and the third electrode 536 may include a conductive semiconductor, a metal oxide, a metal silicide, or the like. The first electrode 532 may be coupled to the first ceramic substrate 522, and the second electrode 534 and the third electrode 536 may be coupled to the second ceramic substrate 524. The second electrode 534 and the third electrode 536 may be spaced apart from each other on the second ceramic substrate 524. The second electrode 534 and the third electrode 536 may not be directly connected.

The second electrode 534 and the third electrode 536 may be connected by the power source 550. The power source 550 may be a DC power source. An anode of the power source 550 may be connected to the second electrode 534, and a cathode of the power source 550 may be connected to the third electrode 536.

The N-type semiconductor 542 may be positioned between the first electrode 532 and the second electrode 534. Carriers of the N-type semiconductor 542, that is, electrons, may move from the first electrode 532 to the second electrode 534. The P-type semiconductor 544 may be positioned between the first electrode 532 and the third electrode 536. Carriers of the P-type semiconductor 544, that is, holes, may move from the first electrode 532 to the third electrode 536. Heat may be absorbed by the cooling plate 512 by movement of the carriers and a cooling effect may be achieved. Heat transferred through the N-type semiconductor 542 and the P-type semiconductor 544 may be transferred to the heatsink 514 to be radiated to the outside.

Since the first thermoelectric cooling device 210 capable of radiating heat is positioned inside the column part 200, the first sample holder 10 for the transmission electron microscope according to an embodiment may be cooled. As shown in FIG. 2, the first thermoelectric cooling device 210 may have a core-shell structure. A heat radiating portion 212 may be positioned at a center of the first thermoelectric cooling device 210, and a cooling portion 214 may be positioned at an edge of the first thermoelectric cooling device 210. For example, the cooling portion 214 may be positioned on an inside surface of the first thermoelectric cooling device 210. The cooling portion 214 may be spaced apart from the heat radiating portion 212 and may have a shape surrounding the heat radiating portion 212. The heat radiating portion 212 may be formed having a cylindrical shape, and the cooling portion 214 may be formed having a hollow cylindrical shape.

Although not illustrated in FIG. 2, an N-type semiconductor, a P-type semiconductor, or the like is positioned between the heat radiating portion 212 and the cooling portion 214. The heat radiating portion 212 may correspond to the heatsink 514 of FIG. 3. The cooling portion 214 may correspond to the first ceramic substrate 522 of FIG. 3, and the column part 200 may correspond to the cooling plate 512 of FIG. 3. When the heatsink 514, the first ceramic substrate 522, and the cooling plate 512 that are shown in a form of a flat plate in FIG. 3 are arranged in an embodiment in which the first ceramic substrate 522 and the cooling plate 512 are wound around the heatsink 514, the heatsink 514, the first ceramic substrate 522, and the cooling plate 512 may have a core-shell structure.

Referring to FIG. 1, the stage 100 may extend from the first end portion of the column part 200. The stage 100 may have an xy plane parallel to the first direction x and a second direction y. The second direction y may be a direction perpendicular to the first direction x. The stage 100 may have a thickness extending parallel to a third direction z. The third direction z may be a direction perpendicular to the first direction x and the second direction y.

A sample 110 may be placed above or on the stage 100. The sample 110 positioned above the stage 100. The sample 110 may have a thickness allowing an electron to pass through the sample. For example, a thickness of the sample 110 may be about 70 nm to about 350 nm. Embodiments of the present invention are not limited thereto, and a thickness of the sample 110 may be thinner or thicker than the numerical range mentioned above. Since an electron beam may interact with the sample 110, a preparation method of the sample 110 may be different depending on a type of the sample 110 and information to be obtained from the sample. For example, the sample 110 such as a sufficiently small powder, a biological cell, a virus, or a nanotube may be analyzed by placing the sample above or on a grid so that an image may be obtained. In a case of the sample 110 that may not withstand the high vacuum of the transmission electron microscope, the sample may be prepared by putting the sample in a resin, hardening the resin, and slicing the hardened sample into thin slices.

A relative position of the stage 100 supporting the sample 110 may be adjustable inside the transmission electron microscope. In addition, a sample having poor image contrast may be colored to increase a contrast. A heavy metal compound capable of absorbing or scattering the electron beam may be used for coloring of the sample. In order to make a thickness of the sample constant, a surface of the sample may be polished, which may make the surface of the sample glossy. To this end, mechanical polishing using a diamond powder, chemical etching using an acid, or sputtering with ions may be performed.

The motor part 300 may extend from the second end portion of the column part 200. The motor part 300 may have a hollow cylindrical shape. A diameter of the motor part 300 may be greater than that of the column part 200. A battery 310 may be positioned within the motor part 300. The battery 310 may be connected to the first thermoelectric cooling device 210. The first thermoelectric cooling device 210 may be operated by receiving power from the battery 310. The battery 310 may be charged. The battery 310 may be rechargable.

A second sample holder 20 for a transmission electron microscope according to an embodiment will be described with reference to FIG. 4.

Figure 4:
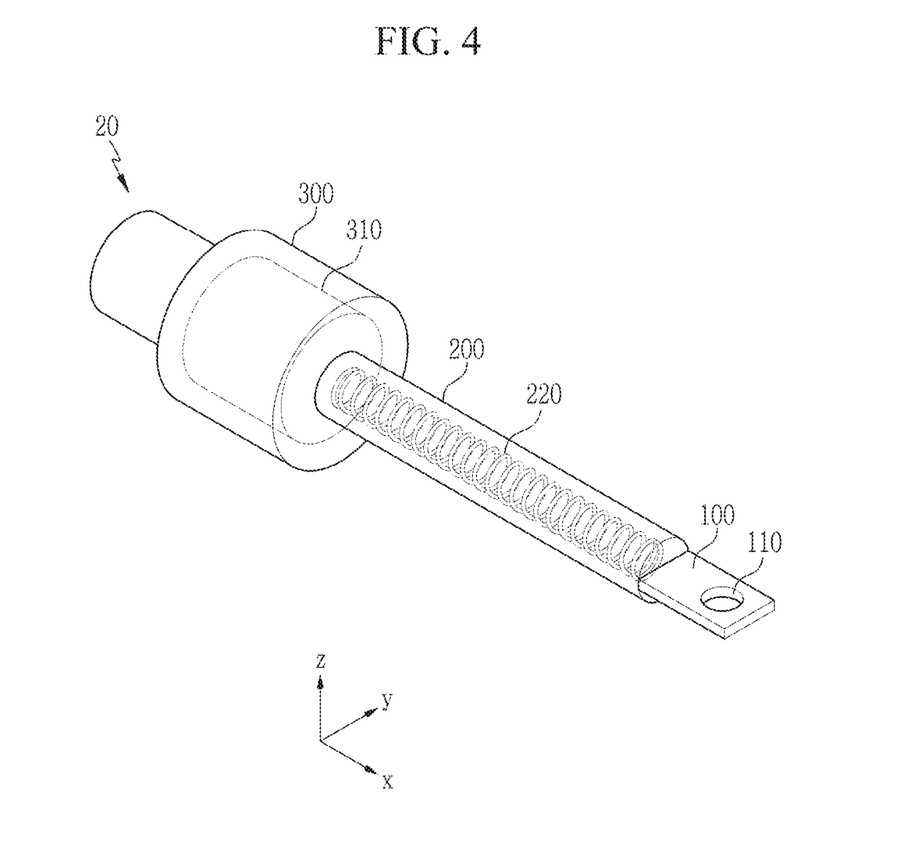
FIG. 4 is a perspective view illustrating a sample holder for a transmission electron microscope according to an embodiment.

FIG. 4 is a perspective view illustrating the second sample holder 20 for the transmission electron microscope according to an embodiment.

Since the second sample holder 20 shown in FIG. 4 has substantially the same parts as the first sample holder 10 shown in FIGS. 1 to 3, a description thereof may be omitted. A shape of a thermoelectric cooling device of the second sample holder 20 may be different from that of the first sample holder 10.

As shown in FIG. 4, the second sample holder 20 for the transmission electron microscope according to an embodiment may include the column part 200, the stage 100 positioned at the first end portion of the column part 200, and the motor part 300 positioned at the second end portion of the column part 200.

The column part 200 may have a cylindrical shape elongated along the first direction x. A second thermoelectric cooling device 220 may be positioned inside the column part 200.

In the first sample holder 10, the first thermoelectric cooling device 210 may have a core-shell structure, and in the second sample holder 20, the second thermoelectric cooling device 220 may have a coil structure. The second thermoelectric cooling device 220 may have a shape winding around a central axis extending in a direction parallel to the first direction x. The second thermoelectric cooling device 220 with the coil structure may be positioned from the first end portion to the second end portion of the column part 200.

A cross-sectional shape of the second thermoelectric cooling device 220 may include a heat radiating portion positioned at a center of the thermoelectric cooling device, and a cooling portion surrounding the heat radiating portion positioned at an edge of the thermoelectric cooling device. A cross-sectional diameter of the second thermoelectric cooling device 220 of an embodiment may be smaller than a cross-sectional diameter of the first thermoelectric cooling device 210.

Since the second thermoelectric cooling device 220 may be formed in a coil shape in an embodiment, a surface area of the second thermoelectric cooling device 220 may be increased. Therefore, the second sample holder 20 and the sample 110 placed above the stage 100 of the second sample holder 20 may be cooled more efficiently.

Next, a third sample holder 30 for a transmission electron microscope according to an embodiment will be described with reference to FIGS. 5 and 6.

Figure 5:
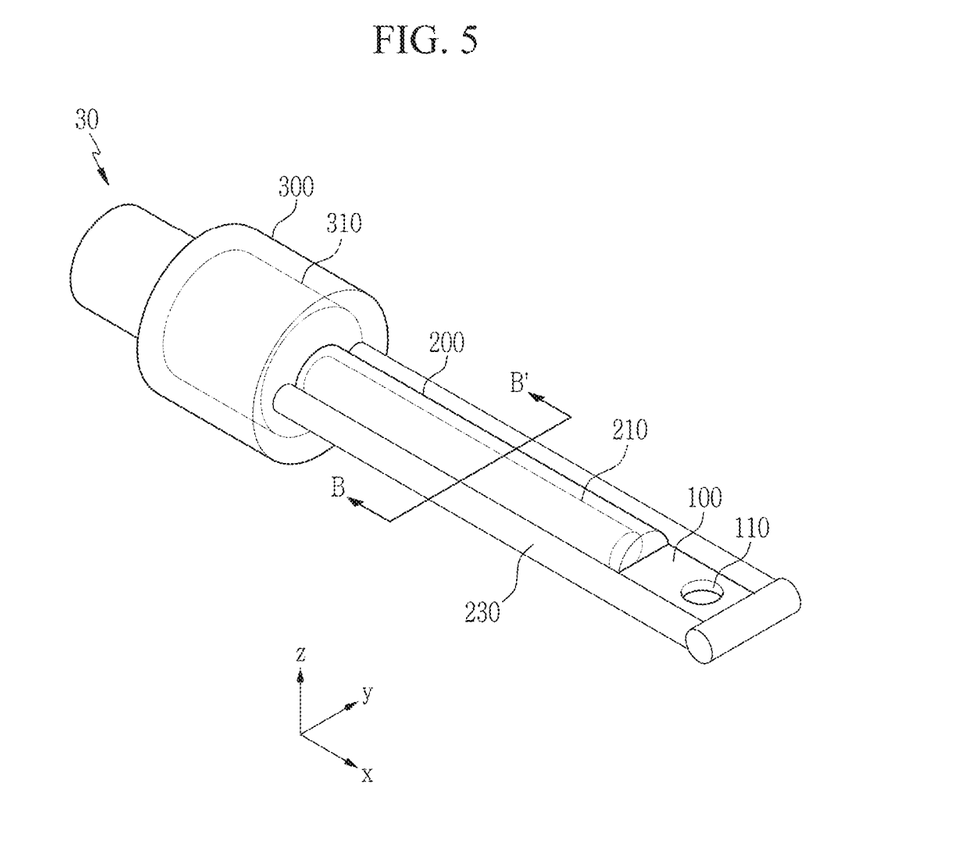
FIG. 5 is a perspective view illustrating a sample holder for a transmission electron microscope according to an embodiment.
Figure 6:
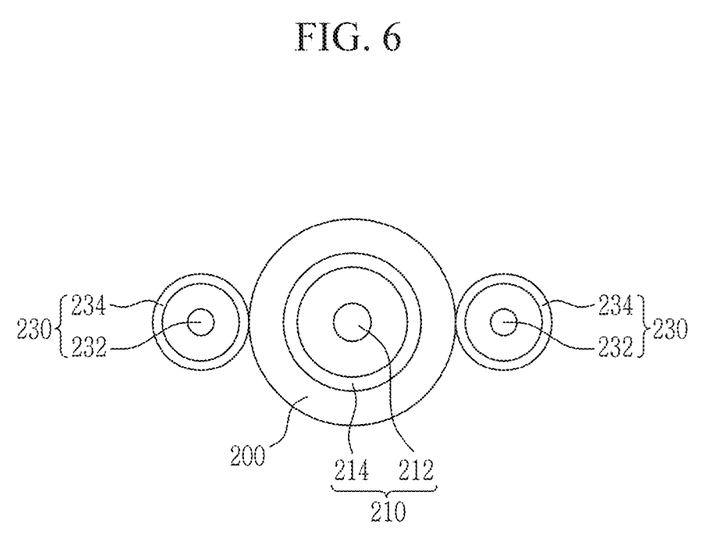
FIG. 6 is a cross-sectional view taken along line B-B' of FIG. 5.

FIG. 5 is a perspective view illustrating the third sample holder 30 for the transmission electron microscope according to an embodiment, and FIG. 6 is a cross-sectional view taken along line B-B' of FIG. 5.

Since the third sample holder 30 shown in FIGS. 5 and 6 have substantially the same parts as the first sample holder 10 shown in FIGS. 1 to 3, a description thereof may be omitted. The third sample holder 30 includes an auxiliary thermoelectric cooling device.

As shown in FIGS. 5 and 6, the third sample holder 30 for the transmission electron microscope according to an embodiment includes the column part 200, the stage 100 positioned at the first end portion of the column part 200, and the motor part 300 positioned at the second end portion of the column part 200.

The column part 200 may have a cylindrical shape elongated along the first direction x. The first thermoelectric cooling device 210 may be positioned inside the column part 200.

In the third sample holder 30, the auxiliary thermoelectric cooling device 230 may be positioned outside the column part 200. The auxiliary thermoelectric cooling device 230 may be positioned adjacent to a periphery of the stage 100 as well as adjacent to the outside of the column part 200. The auxiliary thermoelectric cooling device 230 may be positioned to surround the periphery of the stage 100. A position of the auxiliary thermoelectric cooling device 230 is not limited thereto and may be variously disposed. For example, the auxiliary thermoelectric cooling device 230 may be positioned to surround the periphery of the stage 100, but may not be positioned at a periphery of the column part 200. Alternatively, the auxiliary thermoelectric cooling device 230 may be positioned outside the column part 200 and may not be positioned at adjacent to the periphery of the stage 100. Alternatively, the auxiliary thermoelectric cooling device 230 may be positioned to cover at least a portion of an upper surface or a lower surface of the stage 100.

The auxiliary thermoelectric cooling device 230 may be positioned to at a portion of the outside of the column part 200. The auxiliary thermoelectric cooling device may be positioned to entirely surround the outside of the column part 200. As a surface area of the auxiliary thermoelectric cooling device 230 increases, cooling effects of the third sample holder 30 and the sample 110 placed above the stage 100 of the third sample holder 30 may be further improved. For example, with an increase in the surface area of the auxiliary thermoelectric cooling device 230, the sample 110 may be cooled to a lower temperature in a shorter time.

Each of the first thermoelectric cooling device 210 and the auxiliary thermoelectric cooling device 230 may have a core-shell structure. The heat radiating portion 212 may be positioned at a center of the first thermoelectric cooling device 210, and the cooling portion 214 may be positioned at an edge of the first thermoelectric cooling device 210. The cooling portion 214 may be spaced apart from the heat radiating portion 212 and may have a shape surrounding the heat radiating portion 212. The heat radiating portion 212 may be formed in a cylindrical shape, and the cooling portion 214 may be formed in a hollow cylindrical shape.

Although not illustrated in FIG. 6, an N-type semiconductor, a P-type semiconductor, or the like may be positioned between the heat radiating portion 212 and the cooling portion 214.

A heat radiating portion 232 may be positioned at a center of the auxiliary thermoelectric cooling device 230, and a cooling portion 234 may be positioned at an edge of the auxiliary thermoelectric cooling device 230. The cooling portion 234 may be spaced apart from the heat radiating portion 232, and may have a shape surrounding the heat radiating portion 232. The heat radiating portion 232 may be formed in a cylindrical shape, and the cooling portion 234 may be formed in a hollow cylindrical shape.

Although not illustrated in FIG. 6, an N-type semiconductor, a P-type semiconductor, or the like may be positioned between the heat radiating portion 232 and the cooling portion 234.

Embodiments of the present invention are not limited to embodiments described herein, and at least one of the first thermoelectric cooling device 210 and the auxiliary thermoelectric cooling device 230 may not have a core-shell structure. For example, the first thermoelectric cooling device 210 may have a coil structure, and the auxiliary thermoelectric cooling device 230 may have a core-shell structure. Alternatively, the first thermoelectric cooling device 210 may have a core-shell structure, and the auxiliary thermoelectric cooling device 230 may have a coil structure.

Hereinafter, a sample analysis system including a sample holder 720 for the transmission electron microscope according to an embodiment will be described with reference to FIG. 7.

Figure 7:
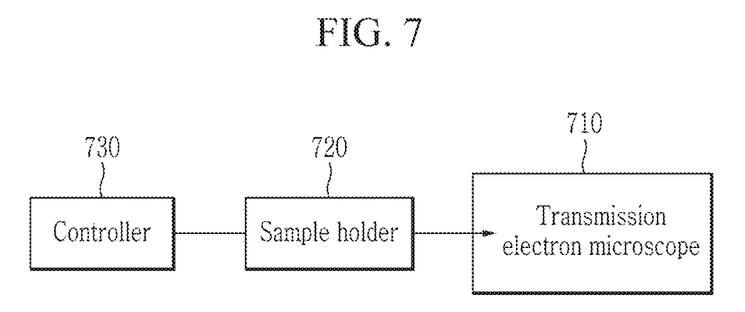
FIG. 7 is a block diagram illustrating a sample analysis system according to an embodiment.

FIG. 7 is a block diagram illustrating the sample analysis system according to an embodiment.

As shown in FIG. 7, the sample analysis system according to an embodiment includes a transmission electron microscope 710, a sample holder 720 insertable into the transmission electron microscope 710, and a controller 730 controlling a movement of the sample holder 720.

The transmission electron microscope 710 may form an image of a sample by transmitting an electron beam through the sample and recording the electrons that are transmitted through the sample. For example, when a polarized electron beam emitted from an electron gun illuminates an object, a transmission wave of electrons that transmit through the object may be generated. The transmission wave may be magnified by an electronic lens to create an enlarged image of the object. The enlarged image may be formed on a fluorescent plate, where the enlarged image may be seen with the naked eye.

The sample holder 720 may be formed of any one of various sample holders for the transmission electron microscope described herein with reference to FIGS. 1 to 6. The sample holder 720 may include a column part, a stage, and a motor part, and a thermoelectric cooling device may be positioned inside the column part. The sample holder 720 may be cooled by the thermoelectric cooling device using a Peltier effect. In this case, a temperature of a sample positioned above the stage of the sample holder 720 may also be lowered. A battery may be positioned in the motor part of the sample holder 720, and the thermoelectric cooling device may receive power through the battery.

The controller 730 may be connected to the sample holder 720 to control the sample holder 720. The controller 730 may control an operation of the thermoelectric cooling device of the sample holder 720. For example, before moving the sample holder 720 into the transmission electron microscope 710, temperatures of the sample holder 720 and the sample may be lowered by operating the thermoelectric cooling device. In this case, an operating time or the like of the thermoelectric cooling device may be adjusted in consideration of a current temperature, a target temperature, and the like of the sample. The controller 730 may control charging of the battery of the sample holder 720. For example, the controller 730 may allow the battery to be charged while an analysis of the sample is being performed.

In addition, the controller 730 may control a movement of the sample holder 720. The controller 730 may move the sample holder 720 inside the transmission electron microscope 710 for imaging. The controller 730 may move the sample holder outside of the transmission electron microscope 710 after the sample analysis is finished. In addition, the controller 730 may adjust a position of the sample holder 720 to find a position of the sample inside the transmission electron microscope 710 for imaging the sample. The controller 730 may adjust a tilt direction, a tilt angle, or the like of the sample holder 720. That is, the controller 730 may control physical movement of the sample holder 720.

Hereinafter, a method for analyzing a sample using the sample holder for the transmission electron microscope according to an embodiment will be described with reference to FIG. 8.

Figure 8:
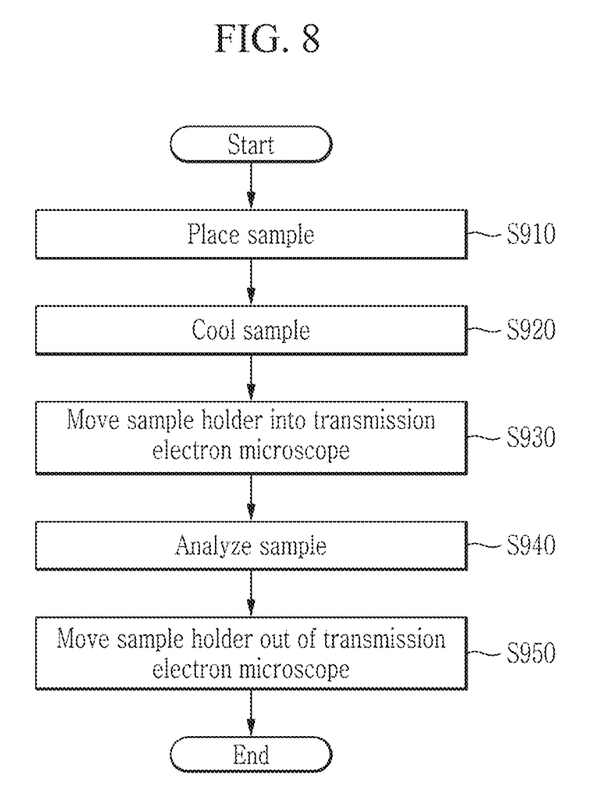
FIG. 8 is a flowchart illustrating a method for analyzing a sample according to an embodiment.

FIG. 8 is a flowchart illustrating a method for analyzing the sample according to an embodiment.

As shown in FIG. 8, in a method for analyzing the sample using the sample holder for the transmission electron microscope according to an embodiment, a sample may be placed (positioned) above or on the stage of the sample holder (S910). The sample 110 positioned above the stage 100 may have a thickness to allow an electron to pass therethrough. The sample 110 may be placed above or on the grid, and the grid may be placed above or on the stage.

The thermoelectric cooling device of the sample holder may be operated to lower temperatures of the sample holder and the sample positioned above the stage of the sample holder (S920). That is, the sample may be cooled. Liquid nitrogen may be injected to maintain a volume inside of the transmission electron microscope in a vacuum state, and a temperature inside the transmission electron microscope may be lowered by the liquid nitrogen. This may cause a temperature difference between the inside and the outside of the transmission electron microscope. A target temperature of the sample may be similar to an internal temperature of the transmission electron microscope. Accordingly, the target temperature of the sample may be lower than room temperature. The sample holder and/or the sample having a temperature similar to room temperature may be cooled to reach the target temperature by adjusting an operating time of the thermoelectric cooling device. For example, the thermoelectric cooling device may be operated for about 30 minutes. However, this is only an example, and an operation time or the like of the thermoelectric cooling device may be varied to achieve different temperatures.

The sample holder may be moved from the outside to the inside of the transmission electron microscope (S930). That is, the sample holder may be loaded in the volume. In this case, the sample holder may be moved to the inside of the transmission electron microscope in a state in which the sample holder is cooled to a temperature similar to that of the inside of the transmission electron microscope. Thus, the sample holder and the sample may have a temperature similar to that of surroundings inside the transmission electron microscope. For example, a temperature of the sample may be within about 5° Celsius of a temperature of the volume of the transmission electron microscope, or may be within about 1° Celsius, or may be within about a half degree Celsius. A difference in the temperatures, if any, may be within a range selected for the imaging and analysis.

The sample positioned above the loaded sample holder may be analyzed (S940). A step of analyzing the sample may be performed immediately after moving the sample holder into the transmission electron microscope. An image may be obtained from the sample, the image may be represented more clearly using image processing technology, and the image may be reconstructed into a three-dimensional image. The battery of the sample holder may be charged while the sample is being analyzed.

The sample holder may be moved from the inside to the outside of the transmission electron microscope (S950). That is, the sample holder may be unloaded from the transmission electron microscope.

By sequentially repeating the steps S910 to S950, analysis of several samples may be performed. For example, a first sample may be placed on a first sample holder, the first sample may be cooled, and then moved into the transmission electron microscope to analyze the first sample. While an analysis of the first sample is in progress, a second sample may be placed on the second sample holder and the second sample may be cooled. In addition, while the analysis of the first sample is in progress, the battery of the first sample holder may be charged. When the analysis of the first sample is completed, the first sample holder may be moved out of the transmission electron microscope and the second sample holder may be moved into the transmission electron microscope to analyze the second sample.

While one sample is being analyzed in this way, the other sample holder may be cooled. If it takes longer to cool the sample holder than to analyze one sample, two or more sample holders may be cooled while one sample is analyzed.

Hereinafter, with reference to FIGS. 9 and 10, a sample analysis image obtained by a method for analyzing the sample using the sample holder for the transmission electron microscope according to an embodiment and a reference example will be compared and described.

Figure 9:
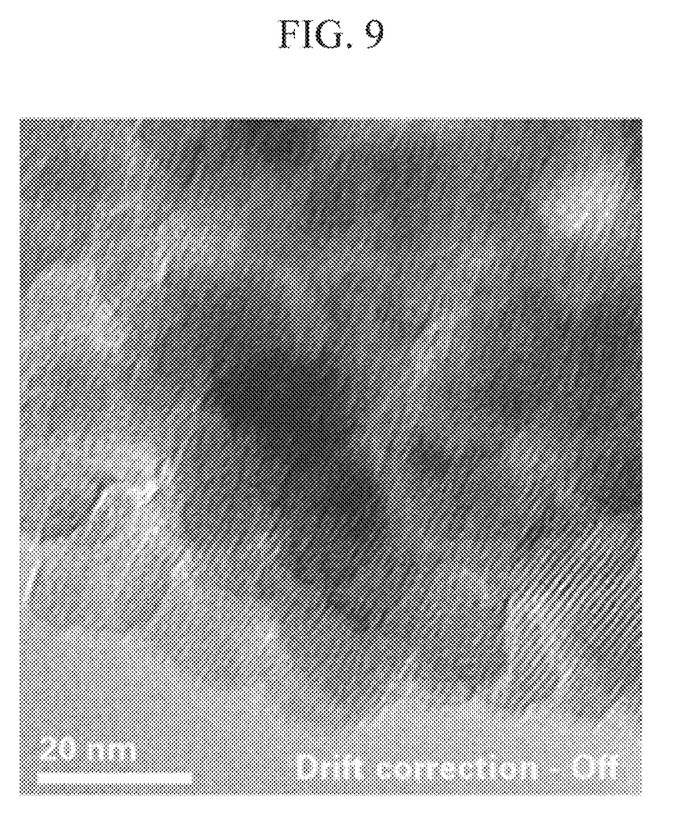
FIG. 9 is a view illustrating a sample analysis image according to a reference example.
Figure 10:
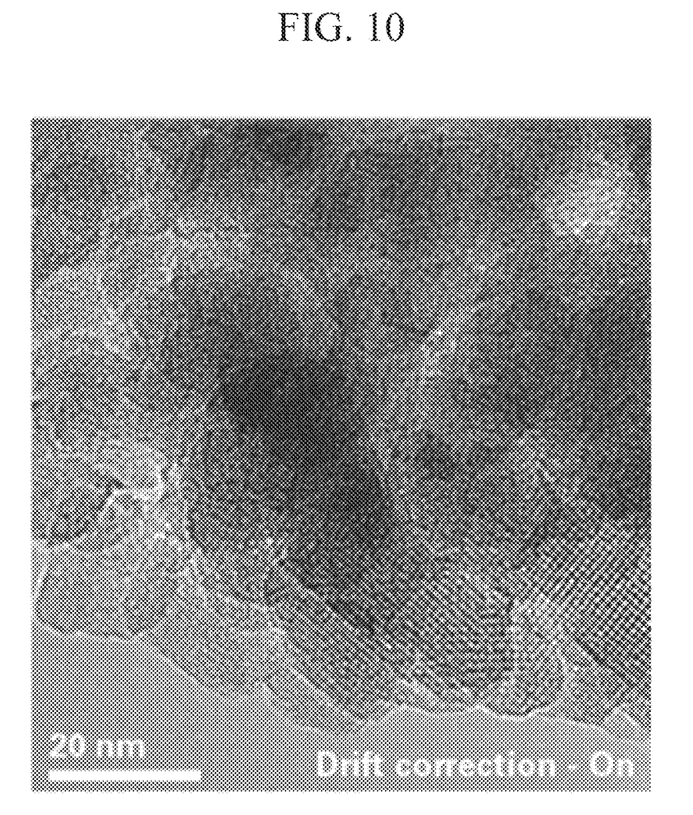
FIG. 10 is a view illustrating a sample analysis image obtained by a method for analyzing the sample according to an embodiment.

FIG. 9 is a view illustrating a sample analysis image according to a reference example. FIG. 10 is a view illustrating the sample analysis image obtained by a method for analyzing the sample according to an embodiment.

An internal temperature of the transmission electron microscope may be lowered by liquid nitrogen injected to maintain the volume inside of the transmission electron microscope in a vacuum state. This may cause a temperature difference between the inside and the outside of the transmission electron microscope. Sample analysis may be performed immediately after moving a sample from an external temperature environment of the transmission electron microscope to the volume inside of the transmission electron microscope. In this case, as shown in FIG. 9, a drift phenomenon of the sample may occur due to a temperature difference between the inside and the outside of the transmission electron microscope.

A sample holder for the transmission electron microscope according to an embodiment may be pre-cooled to a predetermined temperature by the thermoelectric cooling device positioned in the column part of the sample holder. Accordingly, the sample holder may move into the transmission electron microscope in a state where a temperature of the sample may be similar to an internal temperature of the transmission electron microscope. Accordingly, as shown in FIG. 10, a drift phenomenon of the sample may be prevented. For example, an image quality may be improved.

Even when the sample holder is moved to the volume inside of the transmission electron microscope without cooling the sample holder, the drift phenomenon may not appear if analysis is performed after waiting until a temperature of the sample becomes similar to an internal temperature of the transmission electron microscope. However, in this case, since a waiting time is required before starting an analysis of the sample, a rate of sample analysis may be reduced. Since the sample holder for the transmission electron microscope according to an embodiment is cooled in advance while analyzing another sample and is moved to the volume inside of the transmission electron microscope, the sample may be analyzed immediately after the sample holder is moved, and no waiting time may be required. Thus, a rate of sample analysis may be increased.

While this disclosure has been described in connection with what is presently considered to be some practical embodiments, it is to be understood that the invention is not limited to disclosed embodiments, but, on the contrary, is intended to cover various modifications and equivalent arrangements included within the spirit and scope of the appended claims.

What is claimed is:

1. A sample holder for a transmission electron microscope, comprising:
 a column part that extends in a first direction;
 a stage configured to receive a sample, the stage disposed at a first end portion of the column part;
 a motor part disposed at a second end portion of the column part; and
 a thermoelectric cooling device disposed inside the column part,
 wherein the thermoelectric cooling device includes:
  a core-shell structure that extends in the first direction, or
  a coil structure that extends in the first direction.

2. The sample holder of claim 1, wherein the thermoelectric cooling device includes the core-shell structure and comprises:
 a heat radiating portion disposed at a center of the thermoelectric cooling device; and
 a cooling portion that is spaced apart from the heat radiating portion and surrounds the heat radiating portion.

3. The sample holder of claim 2, wherein the heat radiating portion has a cylindrical shape and the cooling portion has a hollow cylindrical shape.

4. The sample holder of claim 1, wherein the thermoelectric cooling device includes the coil structure and has a shape winding around a central axis extending parallel to the first direction.

5. The sample holder of claim 1, further comprising an auxiliary thermoelectric cooling device disposed adjacent to at least one of the column part and a periphery of the stage.

6. The sample holder of claim 5, wherein the auxiliary thermoelectric cooling device includes a core-shell structure that extends in the first direction.

7. The sample holder of claim 1, further comprising a battery disposed in the motor part.

8. The sample holder of claim 7, wherein the battery is electrically connected to the thermoelectric cooling device.

9. A sample analysis system comprising:
a transmission electron microscope;
a sample holder insertable in the transmission electron microscope; and
a controller that is connected to the sample holder to control the sample holder,
wherein the sample holder comprises:
a column part that extends in a first direction;
a stage disposed at a first end portion of the column part and positions a sample;
a motor part disposed at a second end portion of the column part; and
a thermoelectric cooling device configured to disposed inside the column part,
wherein the thermoelectric cooling device includes:
a core-shell structure that extends in the first direction, or
a coil structure that extends in the first direction.

10. The sample analysis system of claim 9, wherein the thermoelectric cooling device includes the core-shell structure comprises:
a heat radiating portion disposed at a center of the thermoelectric cooling device; and
a cooling portion that is spaced apart from the heat radiating portion and surrounds the heat radiating portion.

11. The sample analysis system of claim 9, wherein the sample holder further comprises an auxiliary thermoelectric cooling device disposed adjacent to at least one of the column part and a periphery of the stage.

12. The sample analysis system of claim 9, further comprising a battery in the motor part, wherein the battery is electrically connected to the thermoelectric cooling device.

13. A method for analyzing a sample, comprising:
positioning the sample on a stage of a sample holder;
cooling the sample and the sample holder using a thermoelectric cooling device;
moving the sample holder into a transmission electron microscope;
analyzing the sample; and
charging a battery of the sample holder while the sample is analyzed.

14. The method of claim 13, wherein the sample holder comprises:
a column part that extends in a first direction, wherein the stage is disposed at a first end portion of the column part; and
a motor part disposed at a second end portion of the column part,
wherein the thermoelectric cooling device is disposed inside the sample holder and extends in the first direction.

15. The method of claim 13, wherein the analyzing of the sample is performed immediately after the sample holder is moved into the transmission electron microscope.

* * * * *